US012319298B2

(12) United States Patent
Fritz et al.

(10) Patent No.: US 12,319,298 B2
(45) Date of Patent: Jun. 3, 2025

(54) METHOD FOR CHECKING A FAULT STATUS OF A MOBILE UTILITY UNIT

(71) Applicant: DEERE & COMPANY, Moline, IL (US)

(72) Inventors: Norbert Fritz, Ilvesheim (DE); Martin Kremmer, Laumersheim (DE)

(73) Assignee: Deere & Company, Moline, IL (US)

( * ) Notice: Subject to any disclaimer, the term of this patent is extended or adjusted under 35 U.S.C. 154(b) by 952 days.

(21) Appl. No.: 17/446,012

(22) Filed: Aug. 26, 2021

(65) Prior Publication Data

US 2022/0118988 A1    Apr. 21, 2022

(30) Foreign Application Priority Data

Oct. 21, 2020   (DE) .................. 102020127739.3

(51) Int. Cl.
*B60W 50/02*   (2012.01)
*G07C 5/00*    (2006.01)
*G07C 5/08*    (2006.01)

(52) U.S. Cl.
CPC ......... *B60W 50/0205* (2013.01); *G07C 5/008* (2013.01); *G07C 5/0808* (2013.01)

(58) Field of Classification Search
CPC . B60W 50/0205; G07C 5/008; G07C 5/0808; H03K 17/00; B60R 16/0232
See application file for complete search history.

(56) References Cited

U.S. PATENT DOCUMENTS

| 5,315,972 | A  | * | 5/1994  | Judy ................. B60K 31/00 477/902 |
| 6,237,647 | B1 |   | 5/2001  | Pong et al. |
| 6,382,269 | B1 |   | 5/2002  | Tatsuno |
| 7,565,917 | B2 |   | 7/2009  | Kamiya et al. |
| 9,458,006 | B2 |   | 10/2016 | Quang |
| 10,067,502 | B1 |  | 9/2018  | Delp |
| 10,354,478 | B2 |  | 7/2019  | Guo et al. |

(Continued)

FOREIGN PATENT DOCUMENTS

| AU | 2018204155 A1 | 1/2019 |
| CA | 3111039 A1    | 3/2020 |

(Continued)

OTHER PUBLICATIONS

Norbert Fritz et al., Method for Inspecting a Condition of a Mobile Usage Unit or of a Servicing Station, pending unpublished U.S. Appl. No. 17/444,309, filed Aug. 3, 2021, USPTO's IFW system.

(Continued)

*Primary Examiner* — Michael V Kerrigan
(74) *Attorney, Agent, or Firm* — Taft Stettinius & Hollister LLP; Stephen F. Rost

(57) ABSTRACT

A method for checking a fault status of a mobile utility unit by a maintenance station includes generating via control electronics status data representing a fault status of the mobile utility unit, storing the status data as fault data in a fault memory via the control electronics, classifying via a data processing unit the fault data under different fault classes to identify an applicable fault class, and initiating via the data processing unit a procedural measure for the mobile utility unit according to the identified fault class.

20 Claims, 1 Drawing Sheet

(56) References Cited

U.S. PATENT DOCUMENTS

| | | |
|---|---|---|
| 10,410,182 B1 | 9/2019 | Tang |
| 10,585,439 B2 | 3/2020 | Buttolo et al. |
| 11,388,899 B2 | 7/2022 | Long et al. |
| 2004/0222904 A1 | 11/2004 | Ciolli |
| 2014/0049390 A1 | 2/2014 | Wagner et al. |
| 2014/0074667 A1 | 3/2014 | Smith |
| 2014/0129076 A1 | 5/2014 | Mouchet |
| 2015/0186691 A1 | 7/2015 | Loop |
| 2017/0121019 A1 | 5/2017 | Shin et al. |
| 2017/0234775 A1 | 8/2017 | Finch et al. |
| 2017/0363432 A1 | 12/2017 | Hall et al. |
| 2018/0096541 A1 | 4/2018 | O'Brien et al. |
| 2019/0009908 A1 | 1/2019 | Perez Barrera |
| 2019/0031343 A1 | 1/2019 | Russell |
| 2019/0135048 A1 | 5/2019 | Thompson |
| 2019/0176769 A1 | 6/2019 | Strasdat et al. |
| 2019/0266715 A1 | 8/2019 | Myers et al. |
| 2019/0304100 A1 | 10/2019 | Hever et al. |
| 2019/0344679 A1 | 11/2019 | Miller et al. |
| 2019/0366375 A1 | 12/2019 | Thompson et al. |
| 2020/0064230 A1 | 2/2020 | Kain Venkatadri et al. |
| 2020/0074763 A1* | 3/2020 | Deng .................... G06Q 50/40 |
| 2020/0122599 A1 | 4/2020 | Lee |
| 2022/0068055 A1 | 3/2022 | Fritz et al. |
| 2022/0348322 A1 | 11/2022 | Zemenchik |

FOREIGN PATENT DOCUMENTS

| | | |
|---|---|---|
| CN | 205144465 U | 4/2016 |
| DE | 102012011538 A1 | 1/2013 |
| DE | 102012025033 A1 | 6/2014 |
| DE | 102018222650 A1 | 6/2020 |
| KR | 20160129786 A | 11/2016 |
| WO | 2001058735 A1 | 8/2001 |
| WO | 2014080385 A2 | 5/2014 |
| WO | WO2015088331 A1 | 6/2015 |
| WO | 2019038188 A1 | 2/2019 |
| WO | WO2020023269 A1 | 1/2020 |
| WO | WO2020041899 A1 | 3/2020 |

OTHER PUBLICATIONS

European Search Report and Written Opinion in European Patent Application No. 21189553.7, dated Jan. 26, 2022, 9 pages.
European Search Report issued in European Patent Application No. 21201136.5, dated Mar. 21, 2022, 5 pages.
European Search Report issued in European Patent Application No. 21201137.3, dated Mar. 18, 2022, 7 pages.
European Search Report issued in European Patent Application No. 21201139.9, dated Feb. 21, 2022, 7 pages.
EPAC System, Extended Performance Air Cleaner by Maradyne Filtration Systems, accessed from <URL: maradynefiltration.com/epac-system.html> on Jul. 19, 2021, 1 page.
Geareye, The ultimate tracking solution for your gear, accessed from <URL: https://www.geareye.co> on Jul. 19, 2021, 10 pages.
GX390 Engine with Cyclone Air Cleaner, Honda Engines introduces new Cyclone Air Cleaner, accessed from <URL: https://www.heavyequipmentguide.ca/article/22534/honda-engines-introduces-new-cyclone-air-cleaner> on Jul. 19, 2021, 5 pages.

* cited by examiner

METHOD FOR CHECKING A FAULT STATUS OF A MOBILE UTILITY UNIT

RELATED APPLICATIONS

This application claims priority to German Patent Application No. 102020127739.3, filed Oct. 21, 2020, the disclosure of which is hereby expressly incorporated by reference in its entirety.

FIELD OF THE DISCLOSURE

The present disclosure relates to a method for checking a fault status of a mobile utility unit by a maintenance station.

BACKGROUND

Mobile utility units, such as agricultural or forestry machinery, are usually maintained at defined time intervals with the latest status of various technical functions also checked at the same time.

There is a need to perform a fault check for a mobile utility unit efficiently.

SUMMARY

According to the present disclosure, a method is used for checking a fault status of a mobile utility unit by a maintenance station. In this method, status data representing a fault status of the utility unit is generated. The status data is generated in the utility unit itself. The status data is stored as fault data. The fault data may be identical to the status data, or may be data derived from the status data (by further data processing). The fault data may be stored as specific fault codes, for example.

The fault data is classified under different fault classes. The classification is used to identify from among the fault classes provided a fault class applicable to the particular fault data. In other words, specific fault data is analyzed and assigned to an applicable fault class. The different fault classes are clearly defined before the method is carried out. In particular, a defined assignment of theoretically possible fault statuses, or fault data, to different fault classes is provided before the method is carried out (possibly in the form of a calibration). Then, while the method is being carried out, the classification is performed on the basis of the defined assignment provided.

At least one procedural measure for the utility unit is initiated according to the identified fault class.

The aforementioned method steps allow a simple method structure that uses low data-processing complexity to provide efficient checking of a fault status at the utility unit. In addition, the aforementioned method steps allow technically simple automation of the desired fault check. Efficient fault diagnosis of the utility unit is hence possible using the method. Maintenance personnel traditionally used for fault checking and for initiating suitable procedural measures can be relieved of the associated burden.

Initiating a procedural measure according to the identified fault class also includes the possibility of a procedural measure not being initiated for at least one identified fault class. It is advantageous to omit initiating a procedural measure when the identified fault class corresponds to only minor fault statuses that are not critical to the working operation of the utility unit, and the maintenance station then need not provide any further support.

The status data is generated by suitable electronics, in particular control electronics, in the utility unit. The electronics monitor, for example, specific operating states of the utility unit, and recognize various faulty operating states as fault statuses. In particular, the fault data resulting from the status data is stored in the control electronics, for instance in a suitable fault memory.

For the purpose of performing the method, at least one of the following fault classes is provided:
F1) no fault-related work is needed on the utility unit;
F2) fault-related work needs to be carried out on the utility unit by the maintenance station;
F3) fault-related work needs to be carried out on the utility unit by maintenance personnel.

The aforementioned fault class F1) is applicable, for example, when the ascertained fault status of the utility unit is immaterial, or not critical, to the continued operation of the utility unit.

The aforementioned fault class F2) is identified as applicable, for example, when the ascertained fault status can be handled in, or by, the maintenance station. Such a fault status may be, for instance, a fluid level that is too low, or dirty sensors. Such fault statuses can be handled and resolved in the maintenance station, in particular in an automated manner by the maintenance station itself.

The aforementioned fault class F3) applies, for example, when maintenance personnel are required to handle and resolve the fault status. Fault statuses given by fault class F3) therefore cannot be resolved by the maintenance station itself, or at least not solely by the maintenance station itself. Instead, support by maintenance personnel is required. This may be the case, for instance, when the fault has very complex causes, or the sources of the fault are difficult to access.

At least one of the following procedural measures is advantageously provided:
M1) the utility unit is enabled for further work;
M2) the fault status is handled in the maintenance station and/or by the maintenance station;
M3) the utility unit is disabled for further work.

Any or all of the procedural measures provided are initiated by the maintenance station. In this case, the maintenance station generates and sends to the utility unit specific control signals, for example, in order to enable the utility unit for further work in accordance with procedural measure M1). This is appropriate, for example, when fault class F1) is identified. The procedural measure M1) supports efficient maintenance of the utility unit in particular when this utility unit is in the form of a (semi-)autonomous vehicle.

In a further embodiment, the maintenance station can activate, in accordance with procedural measure M2), an automated measure (e.g., additional inspection, repair, component replacement on the mobile utility unit). This is appropriate, for example, when fault class F2) is identified.

In a further embodiment, the maintenance station can send, in accordance with procedural measure M3), specific control signals to the utility unit. On the basis of the control signals, suitable control electronics of the utility unit can then disable the utility unit for further operation or work. This procedural measure is appropriate, for example, when fault class F3) is identified. The disabling of the utility unit can be cleared again by an operator (e.g., driver, user, maintenance personnel).

Another conceivable procedural measure is for the maintenance station to output information (e.g., visually or audibly) that is intended in particular for a user, driver or maintenance personnel. This is appropriate as an additional procedural measure, for example, if the aforementioned procedural measure M3) is initiated.

The maintenance station performs the classification of the fault data or the initiation of a procedural measure. This technical embodiment advantageously limits the hardware complexity for performing the method.

Also advantageously, the fault data is stored in a fault memory of the utility unit or is classified in a data processing unit of the maintenance station. These electrical or electronic units help to perform the method efficiently. The aforementioned data processing unit contains all the functions required for processing the fault data, for instance a microprocessor, a memory and in particular also a database for importing the fault data, and suitable algorithms for analyzing and classifying the fault data.

In order to perform the method efficiently, automated data transfer is provided between the utility unit and the maintenance station. This data transfer is designed in particular such that the utility unit has a data interface for transmitting generated fault data to the maintenance station, and the maintenance station has a communications interface for receiving the fault data. The data transfer is performed wirelessly. The data transfer may be bidirectional, i.e., not only from the utility unit to the maintenance station. The data transfer can include, apart from the fault data, also other data material, for instance relevant operating data on the utility unit that has been generated during the operation of the utility unit.

The aforementioned data transfer is associated with encryption and decryption of the data and with authentication of the interfaces or of the maintenance station and the utility unit. This increases the data protection and reliability of the method.

The automated fault checking according to the present disclosure is advantageously deployed in areas of use in which specific automation functions are particularly suitable for increasing efficiency, for instance in large agricultural enterprises or in an autonomous or semi-autonomous vehicle fleet.

The mobile utility unit may be a utility vehicle (e.g., an agricultural vehicle such as a tractor, a forestry vehicle, or a construction vehicle).

The utility vehicle is in particular in the form of an autonomous or semi-autonomous vehicle. The disclosed method steps can be used to increase the degree of automation of the vehicle efficiently.

It can be advantageous for the maintenance station either to be designed to be entirely stationary or to be designed partially as a mobile maintenance unit (in addition to a stationary portion) or entirely as a mobile maintenance unit. The mobile maintenance unit may be airborne (e.g., a flying drone) or land-based (e.g., moving robotic arm, travelling service vehicle). In certain circumstances, an at least partially mobile maintenance station can perform a fault check on the selected mobile utility unit(s) even more efficiently and economically. This is the case, for instance, if the utility unit is part of a vehicle fleet that is meant to be checked for the status of all the fleet vehicles.

BRIEF DESCRIPTION OF THE DRAWINGS

The above-mentioned aspects of the present disclosure and the manner of obtaining them will become more apparent and the disclosure itself will be better understood by reference to the following description of the embodiments of the disclosure, taken in conjunction with the accompanying drawing, wherein:

The FIGURE is a schematic of a mobile utility unit and a maintenance station.

Corresponding reference numerals are used to indicate corresponding parts in the drawings.

DETAILED DESCRIPTION

Figure 1:
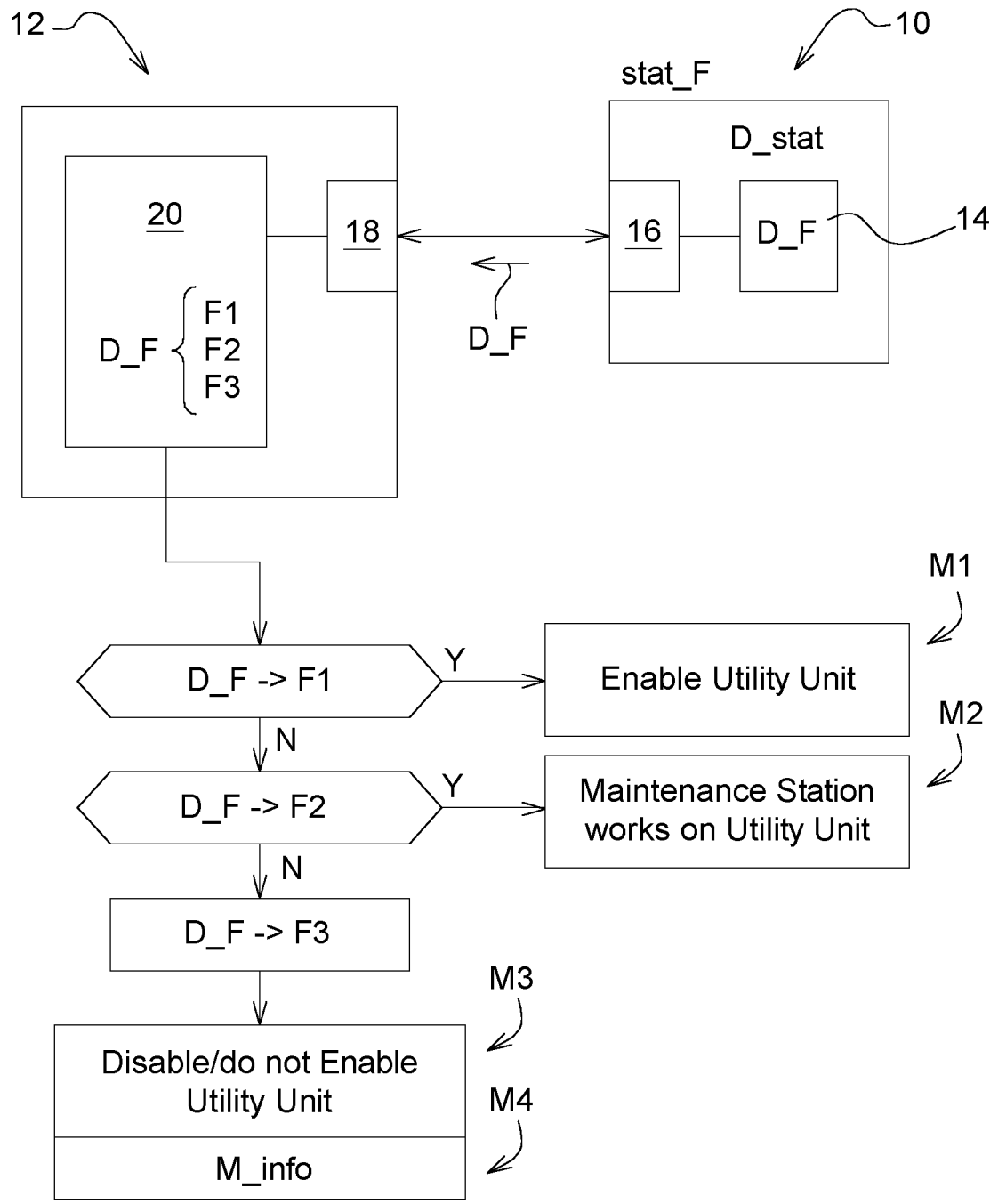

The embodiments of the present disclosure described below are not intended to be exhaustive or to limit the disclosure to the precise forms disclosed in the following detailed description. Rather, the embodiments are chosen and described so that others skilled in the art may appreciate and understand the principles and practices of the present disclosure.

FIG. 1 shows schematically a mobile utility unit 10 and a maintenance station 12, which is external to the utility unit 10. The maintenance station 12 is used for maintaining the utility unit 10, in particular for checking a fault status of the utility unit 10. Various method steps of the method for checking the fault status are presented in the form of a flow diagram in FIG. 1.

The mobile utility unit 10 is a utility vehicle, for example, in particular a tractor. The utility unit 10 is brought, either by a driver or as an autonomous or semi-autonomous vehicle without a driver, to the maintenance station 12 for maintenance and in particular for checking a fault status.

Various fault statuses stat_F are detected, and corresponding status data D_stat is generated, in the utility unit 10 (for instance, using suitable control electronics). This status data D_stat is stored (after optional further processing) as fault data D_F in a fault memory 14 of the utility unit 10.

The utility unit 10 has a data interface 16 for transmitting the fault data D_F to the maintenance station 12. The transmission of the fault data D_F is requested by a data-communications mechanism, for instance by the maintenance station 12. The latter has a communications interface 18, which receives the transmitted fault data D_F and, if applicable, also deals with further data transfer.

The communications interface 18 is connected to a data processing unit 20, in which the received fault data D_F is classified under different provided fault classes F1, F2, F3. This classification is used to identify the fault class F1 or F2 or F3 that applies to the particular fault data D_F. The processing unit 20 comprises for the purpose of analyzing, assessing and classifying the fault data D_F corresponding functionalities, for instance a microprocessor, a memory and/or a database and suitable algorithms.

The maintenance station 12 initiates at least one procedural measure according to the identified fault class F1, F2, F3. The exemplary embodiment discloses a total of four different procedural measures M1, M2, M3, and M4.

The identification of fault class F1 means that no fault-related work is needed on the utility unit 10, i.e., the fault status stat_F is not critical. Therefore, the maintenance station 12 initiates a procedural measure M1, as a result of which the maintenance unit 12 enables the utility unit 10 for further work, for instance by sending specific control signals to the utility unit 10.

In the case of fault class F2 being identified, fault-related work needs to be carried out on the utility unit 10 by the maintenance station 12. The maintenance station 12 then initiates the procedural measure M2, according to which the fault status stat_F is handled in the maintenance station 12 or by the maintenance station 12, for instance topping up a (operating) fluid level, cleaning any sensors, increasing a tire pressure.

If fault class F3) is identified as applicable, maintenance personnel are required. The fault status stat_F then cannot be handled solely by the maintenance station 12. Therefore the maintenance station 12 initiates first the procedural measure M3, according to which any further work by the utility unit 10 is disabled (for instance by suitable control signals to the utility unit 10). This disabling can be cleared again by maintenance personnel as part of the fault-related work on the utility unit 10. In addition, the maintenance station 12 initiates a procedural measure M4, which results in specific information M_info being output. This information M_info is output for instance visually or audibly via an indicator unit, and is aimed at relevant people, for example, drivers, users, maintenance personnel. The information M_info includes an indication of the necessary fault-related work on the utility unit 10 by maintenance personnel.

While embodiments incorporating the principles of the present disclosure have been disclosed hereinabove, the present disclosure is not limited to the disclosed embodiments. Instead, this application is intended to cover any variations, uses, or adaptations of the disclosure using its general principles. Further, this application is intended to cover such departures from the present disclosure as come within known or customary practice in the art to which this disclosure pertains and which fall within the limits of the appended claims.

The invention claimed is:

1. A method for checking a fault status of a mobile utility unit by a maintenance station, comprising:
   generating via control electronics status data representing a fault status of the mobile utility unit;
   storing the status data as fault data in a fault memory via the control electronics;
   classifying via a data processing unit the fault data under different fault classes to identify an applicable fault class; and
   initiating via the data processing unit a procedural measure for the mobile utility unit according to the identified fault class, wherein the different fault classes includes a fault class for which the procedural measure comprises the maintenance station generating and transmitting a control signal to the mobile utility unit that disables the mobile utility unit for further work.

2. The method as claimed in claim 1, wherein the identified fault class comprises:
   (a) a first fault class corresponding to no fault-related work is needed on the mobile utility unit;
   (b) a second fault class corresponding to fault-related work needs to be carried out on the mobile utility unit by the maintenance station; and
   (c) a third fault class corresponding to fault-related work needs to be carried out on the mobile utility unit by maintenance personnel.

3. The method as claimed in claim 2, wherein:
   (a) the control signal, for the first fault class, enables, via the data processing unit, the mobile utility unit for further work; and
   (b) the control signal, for the second fault class, performs, via the data processing unit, an automated measure on the mobile utility unit; and
   (c) the control signal, for the third fault class, disables, via the data processing unit, the mobile utility unit for further work.

4. The method as claimed in claim 1, wherein the maintenance station performs the classifying step.

5. The method as claimed in claim 1, wherein the maintenance station performs the initiating step.

6. The method as claimed in claim 1, wherein the mobile utility unit includes the fault memory and the control electronics.

7. The method as claimed in claim 1, wherein the maintenance station includes the data processing unit.

8. The method as claimed in claim 1, further comprising:
   transmitting the fault data to the maintenance station via a data interface of the mobile utility unit.

9. The method of claim 8, further comprising:
   receiving the fault data via a communications interface of the maintenance station.

10. The method as claimed in claim 1, wherein the mobile utility unit includes a utility vehicle.

11. The method as claimed in claim 1, wherein the mobile utility unit includes an agricultural or forestry vehicle.

12. The method as claimed in claim 1, wherein the mobile utility unit includes an autonomous vehicle.

13. The method of claim 1, wherein the different fault classes includes another fault class for which the procedural measure comprises the mobile utility unit being enabled by the maintenance station to perform further work.

14. The method of claim 1, wherein the different fault classes includes another fault class for which the procedural measure comprises the maintenance station performing an automated measure on the mobile utility unit.

15. The method of claim 14, wherein the maintenance station is an at least partially mobile maintenance station, the procedural measure further comprising, deploying the at least partially mobile maintenance station to the mobile utility unit to perform the automated measure.

16. A method for checking a fault status of a mobile utility unit by a maintenance station, comprising:
   generating via control electronics of the mobile utility unit status data representing a fault status of the mobile utility unit;
   storing the status data as fault data in a fault memory of the mobile utility unit via the control electronics;
   classifying via a data processing unit of the maintenance station the fault data under different fault classes to identify an applicable fault class, the applicable fault class comprising a first fault class, and second fault class, and a third fault class; and
   initiating via the data processing unit a procedural measure for the mobile utility unit according to the identified fault class,
   wherein the procedural measure comprises the maintenance station generating and transmitting a control signal for the mobile utility unit, the control signal for:
   (a) the first fault class enables further performance of a work by mobile utility unit,
   (b) the second fault class initiates an automated repair of the mobile utility unit by the maintenance station, and
   (c) the third fault class disables the mobile utility unit from further performance of the work.

17. The method as claimed in claim 16, wherein:
   (a) the first fault class corresponds to no fault-related work is needed on the mobile utility unit;
   (b) the second fault class corresponds to fault-related work needs to be carried out on the mobile utility unit by the maintenance station; and
   (c) the third fault class corresponds to fault-related work needs to be carried out on the mobile utility unit by maintenance personnel.

18. The method as claimed in claim 16, wherein the procedural measure further comprises one or more of the following:

(a) enabling via the data processing unit the mobile utility unit for further work;
(b) performing via the data processing unit an automated measure on the mobile utility unit; and
(c) disabling via the data processing unit the mobile utility unit for further work.

19. The method as claimed in claim 16, further comprising:
   transmitting the fault data to the maintenance station via a data interface of the mobile utility unit; and
   receiving the fault data via a communications interface of the maintenance station.

20. A method for checking a fault status of a mobile utility unit by a maintenance station, comprising:
   generating via control electronics of the mobile utility unit status data representing a fault status of the mobile utility unit;
   storing the status data as fault data in a fault memory via the control electronics;
   classifying via a data processing unit of the maintenance station the fault data under different fault classes to identify an applicable fault class, the identified fault class including one or more of the following: (a) a first fault class corresponding to no fault-related work is needed on the mobile utility unit, (b) a second fault class corresponding to fault-related work needs to be carried out on the mobile utility unit by the maintenance station, and (c) a third fault class corresponding to fault-related work needs to be carried out on the mobile utility unit by maintenance personnel;
   initiating via the data processing unit a procedural measure for the mobile utility unit according to the identified fault class, the procedural measure comprising the maintenance station generating and transmitting a control signal for the mobile utility unit that for: (a) the first fault class comprises enabling via the data processing unit the mobile utility unit for further work, (b) the second fault class comprises performing via the data processing unit an automated maintenance measure by the maintenance station on the mobile utility unit, and (c) the third fault class comprises disabling via the data processing unit the mobile utility unit for further work;
   transmitting the fault data to the maintenance station via a data interface of the mobile utility unit; and
   receiving the fault data via a communications interface of the maintenance station.

* * * * *